United States Patent [19]

Tsuchimoto

[11] 3,773,566

[45] Nov. 20, 1973

[54] METHOD FOR FABRICATING SEMICONDUCTOR DEVICE HAVING SEMICONDUCTOR CIRCUIT ELEMENT IN ISOLATED SEMICONDUCTOR REGION

[75] Inventor: Takashi Tsuchimoto, Rodaira, Japan

[73] Assignee: Hitachi, Ltd., Tokyo, Japan

[22] Filed: Feb. 9, 1971

[21] Appl. No.: 113,938

[30] Foreign Application Priority Data

Feb. 9, 1970 Japan .................................. 45/10660

[52] U.S. Cl. .................... 148/1.5, 148/175, 317/235

[51] Int. Cl. ................................................ H01l 7/54

[58] Field of Search ................. 148/1.5 CP; 317/235

[56] References Cited

UNITED STATES PATENTS

| | | | |
|---|---|---|---|
| 3,390,019 | 6/1968 | Manchester | 148/1.5 |
| 3,556,966 | 1/1971 | Waxman et al. | 204/164 |
| 3,108,914 | 10/1963 | Hoerni | 148/186 |
| 3,386,857 | 6/1968 | Steinmaier | 117/212 |
| 3,479,237 | 1/1969 | Bergh et al. | 156/11 |
| 3,484,313 | 12/1969 | Tauchi et al. | 148/187 |
| 3,523,042 | 8/1970 | Bower et al. | 148/1.5 |
| 3,540,925 | 11/1970 | Athanas et al. | 117/217 |
| 3,562,022 | 2/1971 | Shifrin | 148/1.5 |
| 3,602,781 | 8/1971 | Hart | 317/235 R |
| 3,457,125 | 7/1969 | Kerr | 148/187 |
| 3,473,090 | 10/1969 | Bohannon, Jr. | 317/235 |
| 3,473,093 | 10/1969 | Bilous et al. | 317/235 |
| 3,640,782 | 2/1972 | Brown et al. | 148/187 |
| 3,655,457 | 4/1972 | Duffy et al. | 148/1.5 |
| 3,589,949 | 6/1971 | Nelson | 148/1.5 |

OTHER PUBLICATIONS

Nelson et al. "Radiation Enhanced Diffusion of Boron in Silicon," Applied Physics Letters, Vol. 15, No. 8, 15 Oct. 69, pp. 246–248

*Primary Examiner*—L. Dewayne Rutledge
*Assistant Examiner*—J. M. Davis
*Attorney*—Craig, Antonelli, Stewart & Hill

[57] ABSTRACT

A semiconductor integrated circuit device is fabricated in an epitaxial layer of an *n*-type Si on a substrate of p-type Si by forming semiconductor circuit elements within one surface of the epitaxial layer, forming a mask layer on the surface of the epitaxial layer, forming grooves through the mask layer, which surround each semiconductor circuit element, so as to expose the surface of the epitaxial layer, diffusing boron into the surface of the exposed portions of the epitaxial layer through the grooves, maintaining the substrate at a temperature of 700° C, and directing $10^{16}$ argon ions per square centimeter having an energy of 50 KeV toward the surface, whereby p-type regions are extended quickly from the surface of the epitaxial layer to that of the substrate to isolate the semiconductor circuit elements from each other.

7 Claims, 19 Drawing Figures

INVENTOR
TAKASHI TSUCHIMOTO
BY
Craig, Antonelli, Stewart & Hill
ATTORNEYS

INVENTOR.

TAKASHI TSUCHIMOTO

BY

Craig, Antonelli, Stewart & Hill

ATTORNEYS

INVENTOR
TAKASHI TSUCHIMOTO
BY
Craig, Antonelli, Stewart & Hill
ATTORNEYS

METHOD FOR FABRICATING SEMICONDUCTOR DEVICE HAVING SEMICONDUCTOR CIRCUIT ELEMENT IN ISOLATED SEMICONDUCTOR REGION

This invention relates to a method for fabricating a semiconductor device, more particularly to a method for isolating semiconductor circuit elements from each other.

According to a method generally employed heretofore, a p-n junction is used to isolate semiconductor circuit elements of a semiconductor integrated circuit from each other. For example, a conventional integrated circuit device having isolated circuit elements therein is fabricated in accordance with the steps of preparing a *p*-type semiconductor substrate, forming an *n*-type epitaxial semiconductor layer having a thickness of about 12 $\mu$ on the substrate, forming semiconductor circuit elements, such as transistors, diodes, resistors, and capacitors, within the epitaxial semiconductor layer by utilizing a diffusion method, and forming p-type regions extending from the surface of the epitaxial layer to that of the substrate, between the semiconductor circuit elements, thereby isolating each semiconductor circuit element. This prior art method, however, involves the following drawbacks:

a. A diffusion treatment for an extended period of time at high temperatures is required for forming the isolating layer, resulting in the undesirable diffusion of impurities due to high temperatures and in a deterioration of the operating characteristics. The method is further defective in that an extended period of time is required for the production of the circuit elements.

b. The isolating layer, as is formed by diffusion, extends not only in the direction of depth, but also in the transverse direction. Thus, a large area requirement for the isolating layer reduces the degree of integration of the circuit elements. c. Since a diffusion treatment for an extended period of time at high temperature is required for forming isolated regions, when the diffusion treatment is done after forming the semiconductor circuit elements, a rediffusion of the impurities in the elements occurs, resulting in a deterioration of the predetermined operating characteristics.

Another conventional method for isolating cicuit elements of a semiconductor integrated circuit from each other employs an etching solution to etch away the substrate portion existing between the circuit elements. This method is also defective in that the etched portion extends in the transverse direction thereby reducing the degree of integration of the circuit elements as in (b).

It is, therefore, an object of the present invention to provide a novel method for fabricating a semiconductor device having isolation regions within a semiconductor epitaxial layer on a semiconductor substrate at a low temperature and in a short period of time.

It is another object of the present invention to provide a novel method for fabricating a semiconductor device whose operating characteristics is not influenced by a diffusion treatment for forming isolation regions even effected after forming semiconductor circuit elements within a semiconductor epitaxial layer.

A further object of the present invention is to provide a novel method of isolation which requires a very small area of the surface of the semiconductor substrate for the isolation between circuit elements of a semiconductor integrated circuit thereby improving the degree of integration of the circuit elements of the integrated circuit itself.

In order to attain the above objects, the present invention comprises the steps of forming a thin layer of a semiconductor on a semiconductor substrate in an electrically insulated relation to the substrate, selectively doping the thin layer with the desired impurities to form a plurality of semiconductor electrical circuit elements such as transistors, diodes, resistors and capacitors, doping surface portions of the thin layer, which surround each semiconductor element, with an impurity which reverses the conductivity type of the thin layer, maintaining the thin layer at a temperature in the range of from about 600° C to about 800° C, and irradiating ions of desired elements, which impart to the thin layer a different conductivity type from that of the thin layer, thereby diffusing dopants at the irradiated portions and isolating semiconductor circuit elements from each other.

The present invention is based on a phenomenon that when ion beams irradiate a surface of a semiconductor material, a lot of vacancies are created in the semiconductor material diffusing into the semiconductor material quickly, and that when a surface portion having impurities therein is irradiated by ion beams, the impurities diffuse in the semiconductor material quickly by the effect of the vacancies.

These and other objects and advantages of the present invention will become more apparent to those skilled in the art from a consideration of the following specification and claims, taken in conjunction with the accompanying drawings wherein:

Figure 1:
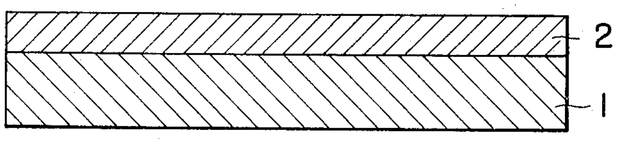
FIGS. 1 through 4 are schematic vertical sectional views showing successive steps of forming isolated regions in a thin layer of a semiconductor in accordance with one embodiment of the present invention.
Figure 2:
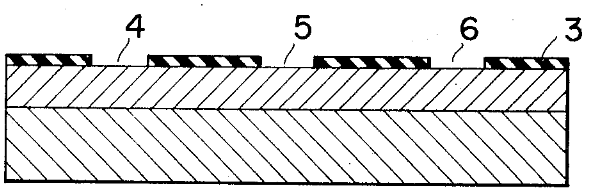
Figure 3:
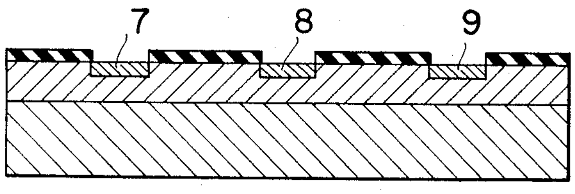
Figure 4:
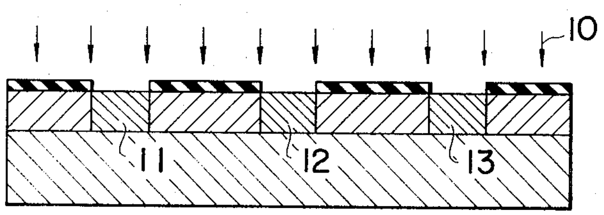
Figure 5:
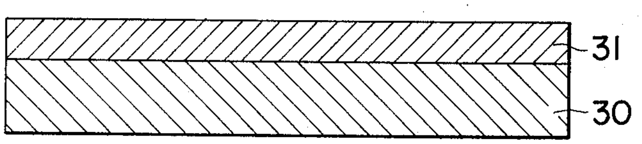
FIGS. 5 through 18 are schematic vertical sectional views showing successive steps of forming a transistor and a resistor in a surface of a thin layer of a semiconductor to obtain a semiconductor integrated circuit in accordance with another embodiment of the present invention.

Referring now to FIGS. 1 through 4, the reference numerals 1 and 2 designate a single crystalline substrate of a p-tpye silicon, and a layer of n-type silocon formed on one surface of the substrate 1, for instance, by the known epitaxial growth method, respectively. While it is customary to form the epitaxial layer 2 by reducing silicon tetrachloride by hydrogen, it may also be formed by the thermal decomposition of monosilane. Although the thickness of the semiconductor epitaxial layer 2 is not limited, it is commonly of the order of from 3 to 10 $\mu$. After forming the epitaxial layer 2, the tetraethoxysilane is subjected to thermal decomposition to deposit a masking layer 3 in the form of a silicon dioxide film on the epitaxial layer 2, and the photoetching technique is utilized to bore holes 4, 5 and 6 of predetermined shapes in the silicon dioxide layer 3 as shown in FIG. 2. These holes 4, 5 and 6 have such a shape that they surround each semiconductor element to be made in the epitaxial layer 2, respectively. The substrate 1 having the above covering is then placed in a thermal diffusion furnace in which a p-type impurity is thermally diffused into the surface of the exposed portions of the semiconductor epitaxial layer 2 through the holes 4, 5 and 6 in the silicon dioxide film 3 to form layers 7, 8 and 9 doped with the p-type impurity as shown in FIG. 3. After forming the doped layers 7, 8 and 9, the semiconductor substrate is then placed into an ion irradiation apparatus and is kept at a temperature of from about 600° C to about 800° C, and beams 10 of ions of an element are directed onto the semiconductor substrate as shown in FIG. 4. At this time, the element must be selected from elements whose ions act in the epitaxial layer 2 as dopants of a different conductivity type from that of the epitaxial layer 2, that is, when the epitaxial layer 2 is of an *n*-type, the ions of the elements must act in the epitaxial layer as dopants of a *p*- or *i*-conductivity type. Therefore, in this embodiment, the element must be selected from B, Al, H, He, Kr, Xe, Ar, Ne, Si, Ge, etc. The ions are not implanted in the portions of the semiconductor epitaxial layer covered by the mask layer 3, but the ions are implanted in the portions of the epitaxial layer exposed by the holes 4, 5 and 6 in the mask layer 3 with the result that p-type regions 11, 12 and 13 extending to the surface of the semiconductor substrate are formed quickly in these portions by a quick diffusion of dopants in the doped layers 7, 8 and 9 which is caused by vacancies. The epitaxial layer 2 is electrically divided into several parts by the p-type regions 11, 12 and 13. After this isolation process, the semiconductor circuit elements are formed in the isolated regions of the epitaxial layer 3 by conventional methods.

Such a *p*-type region may be formed by, for example, implanting $10^{16}$ Al ions per square centimeter having an energy of 50 KeV after the diffusion of the impurity of boron with an impurity concentration of $10^{18}$ $cm^{-3}$ and heating the substrate at a temperature of 750° C.

In the above-mentioned embodiment, though the circuit elements are formed after forming the isolated regions, this invention is not limited to such formation of the isolated regions. The following embodiment shows the formation of the isolated regions after forming the circuit elements.

Figure 6:
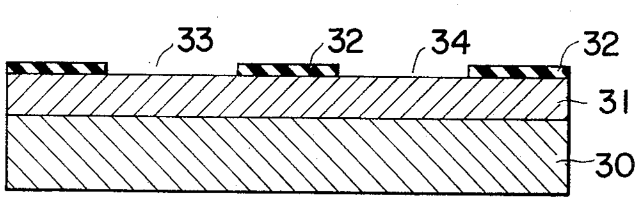
Figure 7:
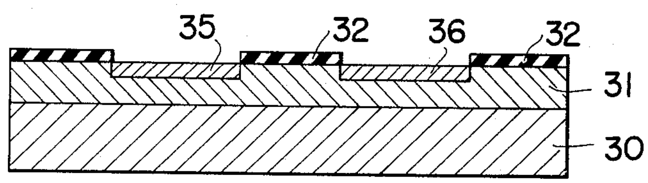
Figure 8:
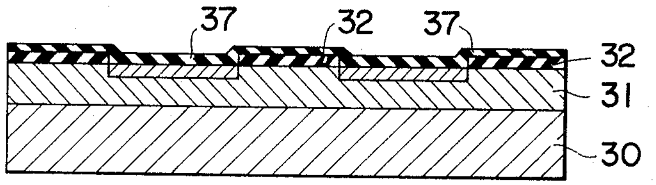
Figure 9:
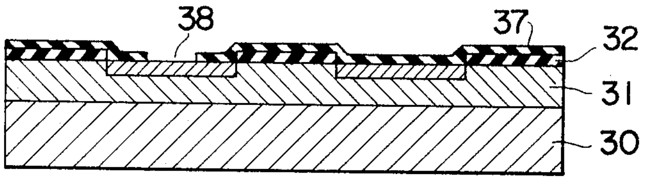
Figure 10:
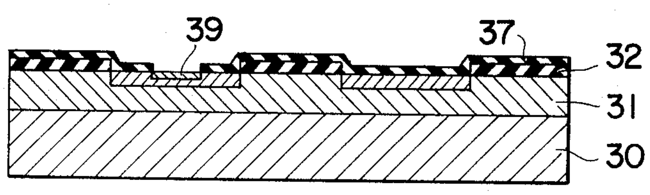
Figure 11:
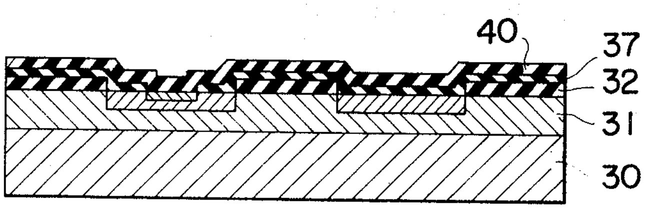
Figure 12:
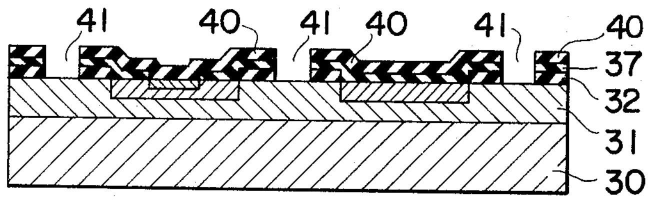
Figure 13:
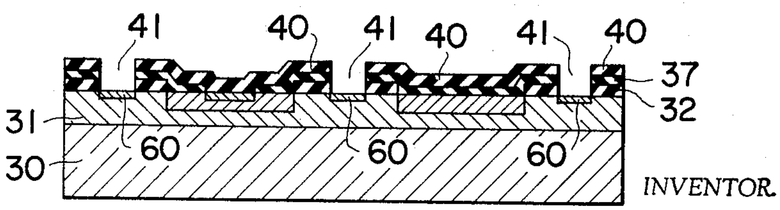

Referring to FIGS. 5 through 18 showing in schematic vertical section the successive steps for the manufacture of an integrated circuit, the reference numerals 30 and 31 designate an n-type silicon substrate and an epitaxial layer of *p*-type silicon about 3 $\mu$ thick epitaxially grown on one surface of the substrate 30, respectively. A silicon dioxide film 32 is deposited on the epitaxial layer 31 and holes 33 and 34 are bored in desired portions of the silicon dioxide film 32 by the photoetching technique as shown in FIG. 6. An *n*-type impurity is thermally diffused into the semiconductor epitaxial layer 31 through these holes 33 and 34 to form *n*-type layers 35 and 36 as shown in FIG. 7. A fresh silicon dioxide film 37 is then deposited on the epitaxial layer as shown in FIG. 8. A hole 38 is bored in a desired portion of the silicon dioxide film 37 as shown in FIG. 9 and a *p*-type impurity is diffused into the *n*-type layer 35 through the hole 38 to form a *p*-type layer 39 therein as shown in FIG. 10. After the above steps, a silicon dioxide film 40 having a sufficient thickness to resist implantation of ions is deposited on the epitaxial layer as shown in FIG. 11, and the photoetching technique is used to bore holes 41 of a desired shaped in the silicon dioxide films covering the epitaxial layer as shown in FIG. 12. Then, phosphorus doped layer 60 is formed by diffusing phosphorus into the surface of the epitaxial layer through holes 41 as shown in FIG. 13.

Figure 14:
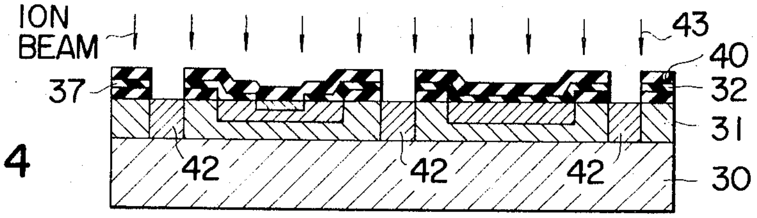

The specimen is then placed into an ion irradiation apparatus and is kept at a temperature of 600° C. Ion beams 43 of phosphorus, shown in FIG. 14, are directed toward the epitaxial layer. The ions are not implanted in the portions of the epitaxial layer covered by the silicon dioxide film 40, but the ions are implanted in the portions of the epitaxial layer exposed from the holes 41 with the result that *n*-type regions 42 extending to the surface of the semiconductor substrate 30 are formed quickly in these portions by a quick diffusion of phosphorus which is caused by vacancies. The semiconductor electrical circuit elements are electrically isolated from each other by these *n*-type regions 42. Such an *n*-type region may be formed by implanting $10^{15}$ phosphorus ions per square centimeter with an energy of 50 KeV after diffusion of the impurity of phosphorus with an impurity concentration of $10^{17}$ $cm^{-3}$.

Figure 15:
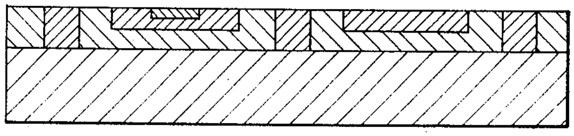
Figure 16:
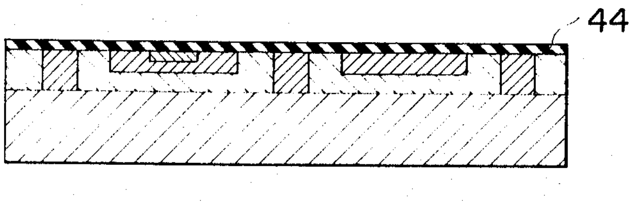
Figure 17:
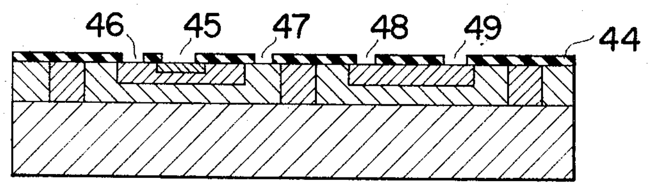
Figure 18:
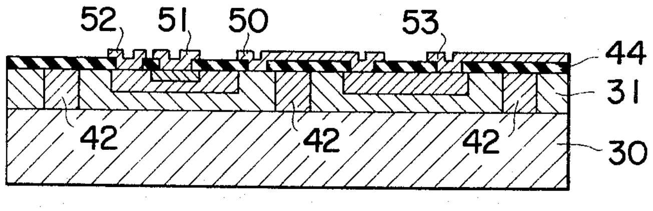

After forming the n-type regions, the silicon dioxide films covering the epitaxial layer are completely removed as shown in FIG. 15. A fresh silicon dioxide film 44 is deposited on the epitaxial layer as shown in FIG. 16 and predetermined holes 45, 46, 47, 48 and 49 are bored in the silicon dioxide film 44 as shown in FIG. 17. These holes expose the electrode portions of the semiconductor circuit elements. After this step aluminum is evaporated over the entire surface of the silicon dioxide film 44, and those portions of the evaporated aluminum layer other than certain predetermined portions 50, 51, 52, 53 and 54 are removed so as to connect the semiconductor circuit elements formed in the epitaxial layer with each other according to a desired circuit pattern to obtain a semiconductor integrated circuit as shown in FIG. 18. The reference numeral 50 in FIG. 18 designates the wiring layer to connect the transistor element with the resistor element.

Figure 19:
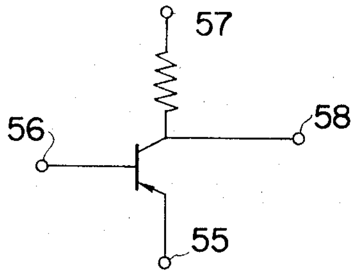
FIG. 19 is a circuit diagram of the semiconductor integrated circuit shown in FIG. 18.

FIG. 19 is a circuit diagram of the basic integrated circuit shown in FIG. 18. In FIG. 19, terminals 55, 56, 57 and 58 correspond to terminals 51, 52, 53 and 54 in FIG. 18, respectively. In the integrated circuit shown in FIG. 18, the semiconductor circuit elements are isolated from the substrate by the p-n junction and are isolated from each other by the *n*-type regions 42.

In the above-mentioned embodiments, as a film to resist implantation of ions, an $SiO_2$ film is employed. In this invention, however, other films, such as an $Si_3N_4$ film, an $A1_2O_3$ film, a laminated film of $SiO_2$ film and $Si_3N_4$ of $SiO_2$ film and $Al_2O_3$ film, and of $Si_3N_4$ film and $Al_2O_3$ film, and metal masks such as Ta, Al, Cr, Mo, Au, Ni etc., are able to be employed instead of the $SiO_2$ film.

Further, the semiconductor preferably employed in the present invention is in no way limited to silicon and many other semiconductors such as Ge, GaAs, $GaAs_{1-x}P_x$ GaP, InSb and InP may be used in lieu of silicon although silicon is employed in the embodiments of the present invention.

Furthermore, though in the described embodiments ion beams of boron and phosphorus are directed toward the substrate heated at a temperature range of 600° C–800° C, the ion beams are not limited to such elements. As mentioned before, the element must be selected from elements whose ions act in the epitaxial layer, as dopants of a different conductivity type from that of the epitaxial layer, that is, when the epitaxial layer is, for example, of an n-type, the ions of the elements must act in the epitaxial layer as dopants of a p- or i-conductivity type. If the epitaxial layer is of a p-type, the ions must act in this layer as dopants of n-conductivity type. The temperature range for heating the substrate should be limited preferably from about 600° C to about 800° C, the reason of which is that, when the temperature is below 600° C, the diffusion velocity of the vacancies becomes slow whereby the diffusion velocity of the impurities in the epitaxial layer becomes very slow, and when the temperature is above 800° C, the diffusion of the semiconductor circuit elements already formed in the epitaxial layer takes place. Additonally, though layers 2 and 31 were described as being made by the epitaxial growth method, it is understood that the present invention is not limited thereto but that instead these layers may also be realized by any other known method, particularly if materials other than Si are used in the substrate. For example, conventional bonding methods may be used.

In the embodiments, though the doped layers 7, 8, 9 and 60 to obtain isolation regions by means of the ion implantation are formed independently of the formation of semiconductor circuit elements, it is understood that the doped layers are able to be formed with the step of formation of semiconductor circuit elements. That is, for example, when the base regions 35 and the resistor region 36 of the semiconductor circuit elements are formed, the doped layer 60 can also be formed at the same time.

In the embodiments, though the energy of the ion beam is of 50 KeV, it will be understood that the present invention is in no way limited to such specific energy and other energies such as 100 KeV may be introduced in lieu of 50 KeV.

The advantages that can be obtained with the above manner of isolation of the circuit elements from each other are as follows:

1. Any substantial spread of the ion implanted region in a direction at right angles with respect to the direction of ion implantation does not occur, unlike the prior art method which employs the diffusion. Therefore, isolation bands of a very small area can be defined by the photoetching method and the degree of integration of circuit elements can be increased thereby. 2. Ions can be implanted in a short period of time and impurities can diffuse from the surface of the epitaxial layer to that of the substrate in a short period of time (about 1 to 2 hours) thereby simplifying the manfacturing steps. Ion implantation at low temperature is also advantageous in that the objectionable influence on the operating characteristics of circuit elements due to diffusion at high temperature can be avoided.

While preferred embodiments of the present invention have been described above by way of example, it will be understood that the present invention is in no way limited to such specific embodiments and many changes and modifications may be made therein without departing from the spirit of the present invention.

I claim:

1. A method for fabricating a semiconductor device comprising the steps of:

preparing semiconductor substrate of one conductivity type;

forming a semiconductor epitaxial layer of opposite conductivity type to the substrate on the surface of the substrate;

forming a semiconductor circuit element within the epitaxial layer;

forming a masking layer on the surface of the epitaxial layer for covering the semiconductor circuit element;

opening holes so as to surround the semiconductor circuit element and to expose surface regions of the epitaxial layer;

doping the surface regions of the epitaxial layer with a desired impurity of said one conductivity type through the holes of the masking layer;

heating the substrate to a temperature in the range of from about 600° C to about 800° C; and implanting ions of a desired element in the epitaxial layer in order to form regions of said one conductivity type, extending from the surface of the epitaxial layer to that of the substrate, said desired element being selected from the elements whose ions act in the epitaxial layer as dopants of a different conductivity type from that of the epitaxial layer during said heating step.

2. A method for fabricating a semiconductor device according to claim 1, wherein the masking layer is selected from the group consisting of $SiO_2$ $Si_3N_4$ $Al_2O_3$, laminated films of $SiO_2$ and $Si_3N_4$, of $SiO_2$ and $Al_2O_3$, and of $Si_3N_4$ and $Al_2O_3$, Ta, Al, Cr, Mo, Au and Ni.

3. A method for fabricating a semiconductor device according to claim 1, wherein said element used in the steps of ion implantation is selected from the group consisting of H, He, Ne, Ar, Kr, Xe, B, Al, N, P, As, Sb, Si, Ge and C.

4. A method for fabricating a semiconductor device according to claim 1, wherein said element used in the steps of ion implantation is selected from the group consisting of H, Ar, B and P.

5. A semiconductor substantially made according to the method of claim 1.

6. A method for fabricating a semiconductor device, comprising the steps of:

forming a thin layer of semiconductor on a semiconductor substrate in an electrically insulated relation thereto;

forming a semiconductor circuit element within the thin layer;

selectively masking a surface of said layer;

selectively doping one surface portion so as to surround the semiconductor circuit element with an impurity which reverses the conductivity type of the thin layer; and irradiating said one surface portion with ions of a predetermined element, which produce a reversal of conductivity in said layer, at a temperature sufficiently high to produce diffusion at the desired speed in said layer at each irradiated surface portion, said temperature being in the range of about 600° C to about 800° C.

7. A method for fabricating a semiconductor device, comprising the steps of:

forming a thin layer of a semiconductor on a semiconductor substrate in an electrically insulated relation thereto;

forming a semiconductor circuit element within the thin layer;

selectively doping one surface portion so as to surround the semiconductor circuit element with an impurity; and irradiating at least said one surface portion with ions of a predetermined element, which produce a reversal of conductivity in said layer, at a temperature sufficiently high to produce diffusion at the desired speed in said layer at each irradiated surface portion.

* * * * *